(12) United States Patent
Choi

(10) Patent No.: US 12,316,257 B2
(45) Date of Patent: May 27, 2025

(54) SYSTEMS AND METHODS FOR AN INTERLOCKING FEATURE ON A POWER MODULE

(71) Applicant: BorgWarner US Technologies LLC, Wilmington, DE (US)

(72) Inventor: Edward Choi, Lake Orion, MI (US)

(73) Assignee: BorgWarner US Technologies LLC, Wilmington, DE (US)

( * ) Notice: Subject to any disclaimer, the term of this patent is extended or adjusted under 35 U.S.C. 154(b) by 220 days.

(21) Appl. No.: 18/159,449

(22) Filed: Jan. 25, 2023

(65) Prior Publication Data
US 2024/0107718 A1    Mar. 28, 2024

Related U.S. Application Data

(60) Provisional application No. 63/377,486, filed on Sep. 28, 2022, provisional application No. 63/377,501, (Continued)

(51) Int. Cl.
*H05K 7/20* (2006.01)
*B60L 3/00* (2019.01)
(Continued)

(52) U.S. Cl.
CPC .............. *H02P 27/06* (2013.01); *B60L 3/003* (2013.01); *B60L 15/007* (2013.01); *B60L 15/08* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01);

*G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01);
(Continued)

(58) Field of Classification Search
CPC ....................... H05K 1/021; H05K 2201/0364
See application file for complete search history.

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| EP | 3751602 A1 * | 12/2020 | ......... H01L 23/3672 |
| WO | 2007093598 A1 | 8/2007 | |

(Continued)

OTHER PUBLICATIONS

EP 3751602 A1, English machine translation (Year: 2020).*
(Continued)

*Primary Examiner* — Mukundbhai G Patel
(74) *Attorney, Agent, or Firm* — Joshua M. Haines; Bookoff McAndrews, PLLC

(57) ABSTRACT

A system includes a power module, wherein the power module includes an interlocking feature on a first surface of the power module; and at least one heat sink, wherein the surface of the at least one heat sink includes a layer of thermal interface material.

20 Claims, 7 Drawing Sheets

Related U.S. Application Data filed on Sep. 28, 2022, provisional application No. 63/377,512, filed on Sep. 28, 2022, provisional application No. 63/378,601, filed on Oct. 6, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H10D 64/01* | (2025.01) |
| *B60L 15/20* | (2006.01) |
| *H03K 19/20* | (2006.01) |

(52) U.S. Cl.
CPC ...... *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,757,170 B2 * | 6/2004 | Lee .............. H01L 23/42 165/185 |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,679,182 B2 * | 3/2010 | Yoshinari .......... H01L 23/49811 257/691 |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |

(56) References Cited

U.S. PATENT DOCUMENTS

| | | | |
|---|---|---|---|
| 10,204,872 B2* | 2/2019 | Kobayashi | H01L 23/04 |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | S et al. | |
| 2004/0042178 A1* | 3/2004 | Gektin | H01L 23/433 |
| | | | 257/E23.09 |
| 2012/0287582 A1 | 11/2012 | Vinciarelli et al. | |
| 2017/0331469 A1 | 11/2017 | Kilb et al. | |
| 2020/0195121 A1 | 6/2020 | Keskar et al. | |
| 2021/0005711 A1 | 1/2021 | Martinez-Limia et al. | |
| 2022/0052610 A1 | 2/2022 | Plum | |
| 2022/0294441 A1 | 9/2022 | Purcarea et al. | |
| 2023/0010616 A1 | 1/2023 | Gschwantner et al. | |
| 2023/0061922 A1 | 3/2023 | Ritter | |
| 2023/0082076 A1 | 3/2023 | Strache et al. | |
| 2023/0126070 A1 | 4/2023 | Oberdieck et al. | |
| 2023/0179198 A1 | 6/2023 | Winkler | |
| 2023/0231210 A1 | 7/2023 | Joos et al. | |
| 2023/0231400 A1 | 7/2023 | Oberdieck et al. | |
| 2023/0231496 A1 | 7/2023 | Syed et al. | |
| 2023/0238808 A1 | 7/2023 | Swoboda et al. | |
| 2023/0268826 A1 | 8/2023 | Yan et al. | |
| 2023/0335509 A1 | 10/2023 | Poddar | |
| 2023/0365086 A1 | 11/2023 | Schumacher et al. | |
| 2023/0370062 A1 | 11/2023 | Wolf | |
| 2023/0378022 A1 | 11/2023 | Kim et al. | |
| 2023/0386963 A1 | 11/2023 | Kim et al. | |
| 2023/0402930 A1 | 12/2023 | Corry et al. | |
| 2023/0420968 A1 | 12/2023 | Oner et al. | |
| 2023/0421049 A1 | 12/2023 | Neidorff | |
| 2024/0006869 A1 | 1/2024 | Kim et al. | |
| 2024/0006899 A1 | 1/2024 | Wernerus | |
| 2024/0006993 A1 | 1/2024 | Barjati et al. | |
| 2024/0022187 A1 | 1/2024 | Fassnacht | |
| 2024/0022240 A1 | 1/2024 | Balaz | |
| 2024/0022244 A1 | 1/2024 | S et al. | |
| 2024/0030730 A1 | 1/2024 | Wernerus | |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0105276 A1 | 3/2024 | Duryea | |
| 2024/0106248 A1 | 3/2024 | Woll et al. | |
| 2024/0106435 A1 | 3/2024 | Zhang et al. | |
| 2024/0113517 A1 | 4/2024 | Sriraj et al. | |
| 2024/0113611 A1 | 4/2024 | Kaufmann et al. | |
| 2024/0113620 A1 | 4/2024 | Ranmuthu et al. | |
| 2024/0113624 A1 | 4/2024 | Southard et al. | |
| 2024/0120558 A1 | 4/2024 | Zhang et al. | |
| 2024/0120765 A1 | 4/2024 | Oner et al. | |
| 2024/0120962 A1 | 4/2024 | Miriyala et al. | |
| 2024/0128851 A1 | 4/2024 | Ruck et al. | |
| 2024/0128859 A1 | 4/2024 | Chen | |
| 2024/0128867 A1 | 4/2024 | Wang et al. | |
| 2024/0146177 A1 | 5/2024 | Mehdi et al. | |
| 2024/0146306 A1 | 5/2024 | Ramkaj et al. | |
| 2024/0149734 A1 | 5/2024 | Eisenlauer | |
| 2024/0162723 A1 | 5/2024 | Zipf et al. | |
| 2024/0178756 A1 | 5/2024 | El-Markhi et al. | |
| 2024/0178824 A1 | 5/2024 | Kazama et al. | |
| 2024/0186803 A1 | 6/2024 | Krieg et al. | |
| 2024/0198937 A1 | 6/2024 | Benqassmi et al. | |
| 2024/0198938 A1 | 6/2024 | Carlos et al. | |
| 2024/0204540 A1 | 6/2024 | Majmunovic et al. | |
| 2024/0204541 A1 | 6/2024 | Majmunovic et al. | |
| 2024/0204671 A1 | 6/2024 | Liu et al. | |
| 2024/0204765 A1 | 6/2024 | Dake | |
| 2024/0213874 A1 | 6/2024 | Junnarkar et al. | |
| 2024/0213971 A1 | 6/2024 | Lee | |
| 2024/0213975 A1 | 6/2024 | Narayanasamy | |
| 2024/0213981 A1 | 6/2024 | Agarwal et al. | |

FOREIGN PATENT DOCUMENTS

| | | |
|---|---|---|
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |

(56) References Cited

FOREIGN PATENT DOCUMENTS

| | | | |
|---|---|---|---|
| WO | 2022229149 | A1 | 11/2022 |
| WO | 2023006491 | A1 | 2/2023 |
| WO | 2023046607 | A1 | 3/2023 |
| WO | 2023094053 | A1 | 6/2023 |
| WO | 2023110991 | A1 | 6/2023 |
| WO | 2023147907 | A1 | 8/2023 |
| WO | 2023151850 | A1 | 8/2023 |
| WO | 2023227278 | A1 | 11/2023 |
| WO | 2023237248 | A1 | 12/2023 |
| WO | 2024006181 | A2 | 1/2024 |
| WO | 2024012743 | A1 | 1/2024 |
| WO | 2024012744 | A1 | 1/2024 |
| WO | 2024022219 | A1 | 2/2024 |
| WO | 2024041776 | A1 | 2/2024 |
| WO | 2024046614 | A1 | 3/2024 |
| WO | 2024049730 | A1 | 3/2024 |
| WO | 2024049884 | A1 | 3/2024 |
| WO | 2024049909 | A1 | 3/2024 |
| WO | 2024056388 | A1 | 3/2024 |
| WO | 2024068065 | A1 | 4/2024 |
| WO | 2024068076 | A1 | 4/2024 |
| WO | 2024068113 | A1 | 4/2024 |
| WO | 2024068115 | A1 | 4/2024 |
| WO | 2024083391 | A1 | 4/2024 |
| WO | 2024093384 | A1 | 5/2024 |
| WO | 2024104970 | A1 | 5/2024 |
| WO | 2024108401 | A1 | 5/2024 |
| WO | 2024110106 | A1 | 5/2024 |
| WO | 2024110265 | A1 | 5/2024 |
| WO | 2024110297 | A1 | 5/2024 |
| WO | 2024114978 | A1 | 6/2024 |
| WO | 2024114979 | A1 | 6/2024 |
| WO | 2024114980 | A1 | 6/2024 |
| WO | 2024128286 | A1 | 6/2024 |
| WO | 2024132249 | A1 | 6/2024 |

OTHER PUBLICATIONS

Balogh, L., "Fundamentals of MOSFET and IGBT Gate Driver Circuits," Texas Instruments Application Report, SLUA618-Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

\* cited by examiner

SYSTEMS AND METHODS FOR AN INTERLOCKING FEATURE ON A POWER MODULE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to power modules, and more specifically, to systems and methods for providing Bond-Line-Thickness (BLT) control and an interlocking feature on a power module to, e.g., facilitate aligning the power module with one or more heat sinks during an assembly process.

INTRODUCTION

The power module is one of the key components in a traction inverter for controlling performance and/or efficiency of a driving system. A critical aspect for performance and reliability stems from the correct Bond-Line-Thickness Control of TIM (Thermal-Interface-Material) and from the correct placement of the power module on the heat sink in a manner that creates a strong bonding integrity between the power module and heat sink.

SUMMARY OF THE DISCLOSURE

In some aspects, the techniques described herein relate to a system including: a power module, wherein the power module includes an interlocking feature on a first surface of the power module; and at least one heat sink, wherein the surface of the at least one heat sink includes a layer of thermal interface material.

In some aspects, the techniques described herein relate to a system, wherein the power module includes the first interlocking feature on a second surface of the power module, wherein the second surface is separated from the first surface by a width of the power module.

In some aspects, the techniques described herein relate to a system, wherein the interlocking feature is a protruding interlocking feature.

In some aspects, the techniques described herein relate to a system, wherein the surface of the at least one heat sink is a flat surface.

In some aspects, the techniques described herein relate to a system, wherein the layer of thermal interface material includes thermal tapes, gels, thermal epoxies, solders, greases, gap-filled pads, and phase change materials.

In some aspects, the techniques described herein relate to a system, wherein the first surface and second surface include an epoxy mold compound or a copper layer.

In some aspects, the techniques described herein relate to a system, wherein the first interlocking feature on the first surface or second surface mates with the surface of the at least one heat sink to form a gap between the first surface or second surface of the power module and the surface of the at least one heat sink.

In some aspects, the techniques described herein relate to a system, wherein the gap between the first surface or second surface of the power module and the surface of the at least one heat sink is filled with thermal interface material.

In some aspects, the techniques described herein relate to a system, wherein the thermal interface material extends across an area of the at least one heat sink where the first interlocking feature on the power module does not mate with the surface of the at least one heat sink.

In some aspects, the techniques described herein relate to a system, wherein the at least one heat sink includes an inlet port or an outlet port.

In some aspects, the techniques described herein relate to a system including: a power module, wherein the power module includes a first interlocking feature on a first surface of the power module; and at least one heat sink, wherein the at least one heat sink includes a second interlocking feature on a surface of the at least one heat sink, wherein the first interlocking feature includes a height greater than a depth of the second interlocking feature, and wherein the surface of the at least one heat sink includes a layer of thermal interface material.

In some aspects, the techniques described herein relate to a system, wherein the power module includes the first interlocking feature on a second surface of the power module, wherein the second surface is separated from the first surface by a width of the power module.

In some aspects, the techniques described herein relate to a system, wherein the first interlocking feature is a protruding interlocking feature.

In some aspects, the techniques described herein relate to a system, wherein the second interlocking feature is a recessed interlocking feature.

In some aspects, the techniques described herein relate to a system, wherein the recessed interlocking feature is a blind cavity.

In some aspects, the techniques described herein relate to a system, wherein the first interlocking feature on the first surface or second surface mates with the second interlocking feature on the surface of the at least one heat sink to form a gap between the first surface or second surface of the power module and the surface of the at least one heat sink.

In some aspects, the techniques described herein relate to a system claim 16, wherein the gap between the first surface or second surface of the power module and the surface of the at least one heat sink is filled with thermal interface material.

In some aspects, the techniques described herein relate to a system, wherein the thermal interface material extends across an area of the surface of the at least one heat sink where the first interlocking feature on the power module does not mate with the second interlocking feature on the at least one heat sink.

In some aspects, the techniques described herein relate to a system, wherein the at least one heat sink includes an inlet port or an outlet port.

In some aspects, the techniques described herein relate to a system, wherein the first surface and second surface include an epoxy mold compound or a copper layer.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the power module may be described as a device, but may refer to any device for controlling the flow of power in an electrical circuit. For example, a power module may be a metal-oxide-semiconductor field-effect transistor (MOSFETs), bipolar junction transistor (BJTs), insulated-gate bipolar transistor (IGBTs), or relays, for example, or any combination thereof, but are not limited thereto.

An interlocking feature, as described herein, on a power module and/or heat sink may eliminate the tools required, during packaging assembly, for ensuring the correct placement of a power module on a heat sink. In addition, the interlocking feature may provide for an increase in the strength of bonding integrity between a power module and a heat sink. The increase in strength provided by the interlocking feature may reduce failure or cracking on a power module by creating strong interlocking bonding and tight control of bond line thickness.

Figure 1:
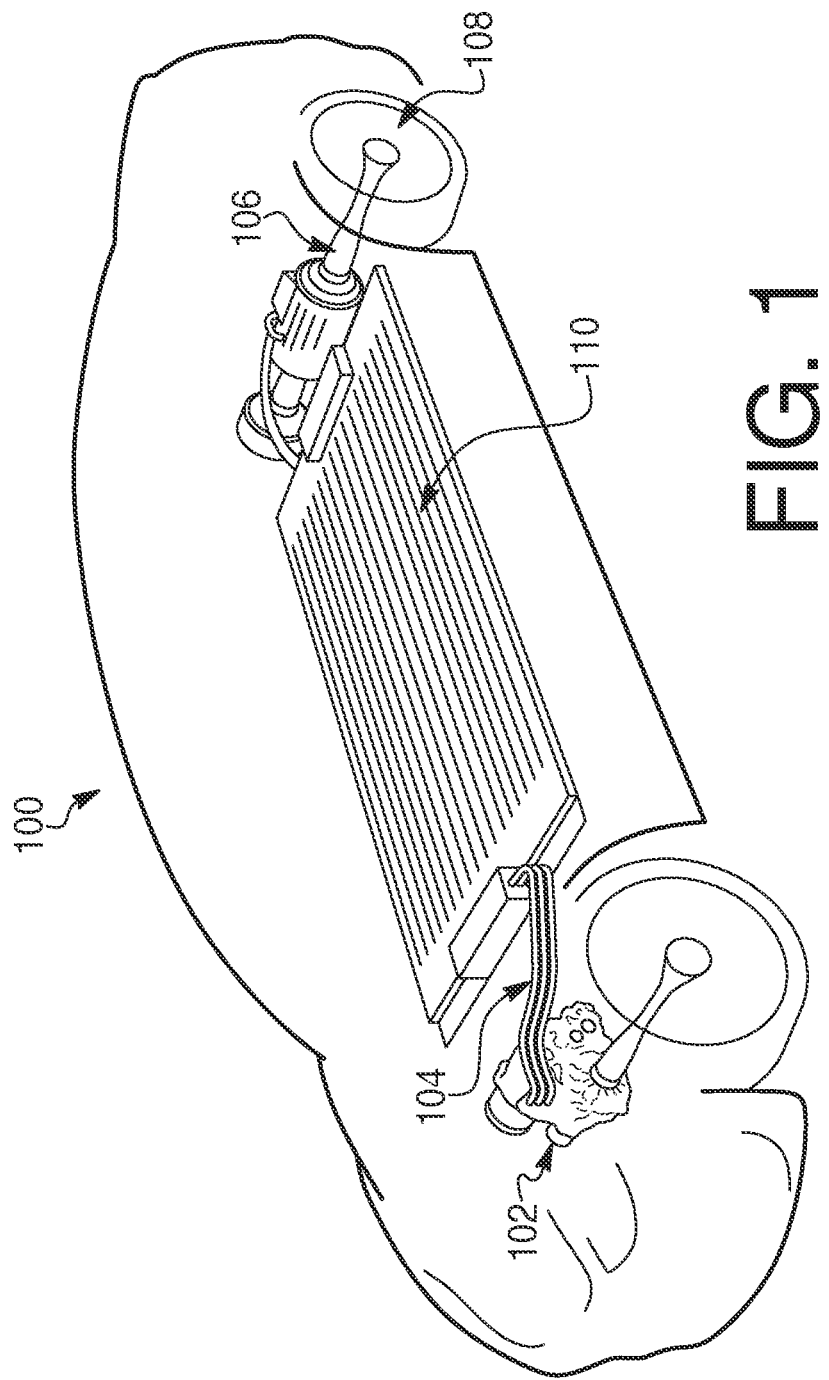
FIG. 1 depicts an exemplary system infrastructure for a vehicle including a traction inverter, according to one or more embodiments.

Turning now to FIG. 1, there is depicted an exemplary system infrastructure for a vehicle including traction inverter 102, according to one or more embodiments of the present disclosure. Electric vehicle 100 may include traction inverter 102, drive motor 106, battery 110, and connectors 104 connecting the inverter 102 and battery 110. Traction inverter 102 may include components to receive electrical power from an external source and output electrical power to charge battery 110 of electric vehicle 100. Traction inverter 102, through the use of a power module, may convert DC power from battery 110 in electric vehicle 100 to AC power, to power motor 106 and wheels 108 of electric vehicle 100, for example, but the embodiments are not limited thereto. The power module may be bidirectional, and may convert DC power to AC power, or convert AC power to DC power, such as during regenerative braking, for example. Traction inverter 102 may be a three-phase inverter, a single-phase inverter, or a multi-phase inverter.

Figure 2A:
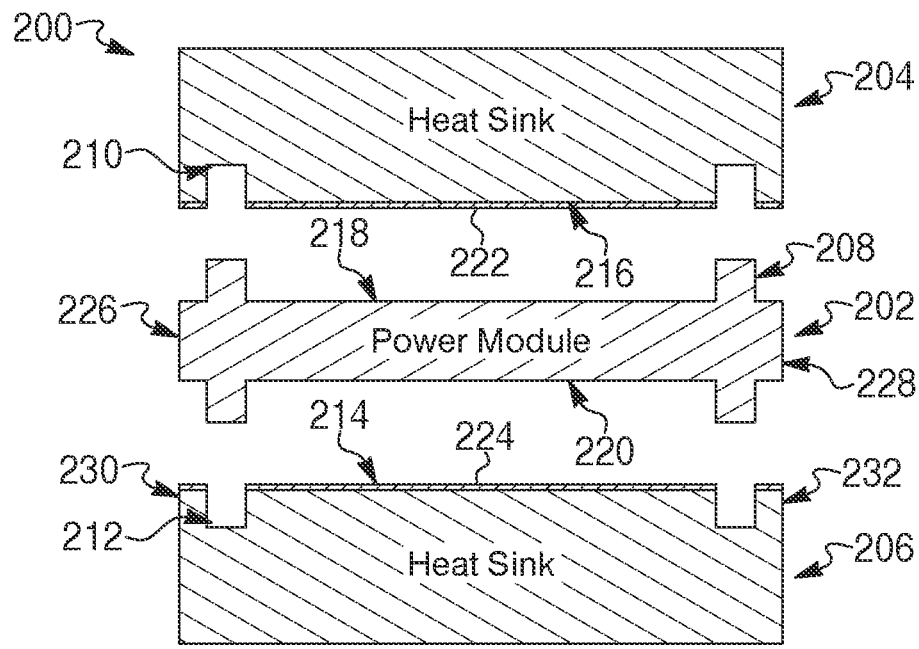
FIG. 2A and FIG. 2B depict a side view of an exemplary system of interlocking features on a power module and heat sinks, according to embodiments of the present disclosure.
Figure 2B:
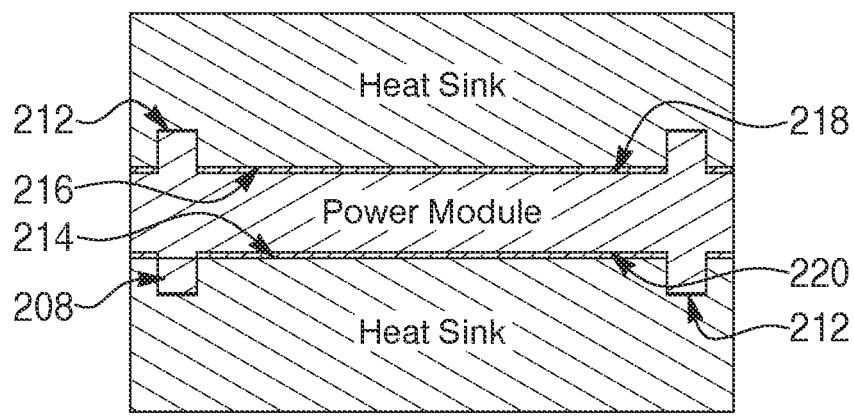

FIGS. 2A and 2B depict a side view of system 200, which may include power module 202, first heat sink 204, second heat sink 206, protruding interlocking features 208, recessed interlocking features 210 and 212, and thermal interface materials 222 and 224. System 200 may include power module 202 where first heat sink 204 may be located above first surface 218 (e.g., a top surface 218) of power module 202 and second heat sink 206 may be located beneath second surface 220 (e.g., a bottom surface 220) of power module 202. The power module 202 may include a plurality of protruding interlocking features 208. Protruding interlocking features 208 may include any suitable shape, geometry and configuration. For example, in some embodiments, protruding interlocking features 208 may actually be replaced with recesses configured to receive corresponding mating protrusions on heat sinks 204, 206. As shown in FIG. 2A, however, in one embodiment, protruding interlocking features 208 include a plurality of protrusions on top surface 218 where the protruding interlocking features 208 include of extensions of top surface 218. Power module 202 may also include a plurality of protruding interlocking features 208 on bottom surface 220 of power module 202 where protruding interlocking features 208 include of extensions of bottom surface 220.

Figure 3A:
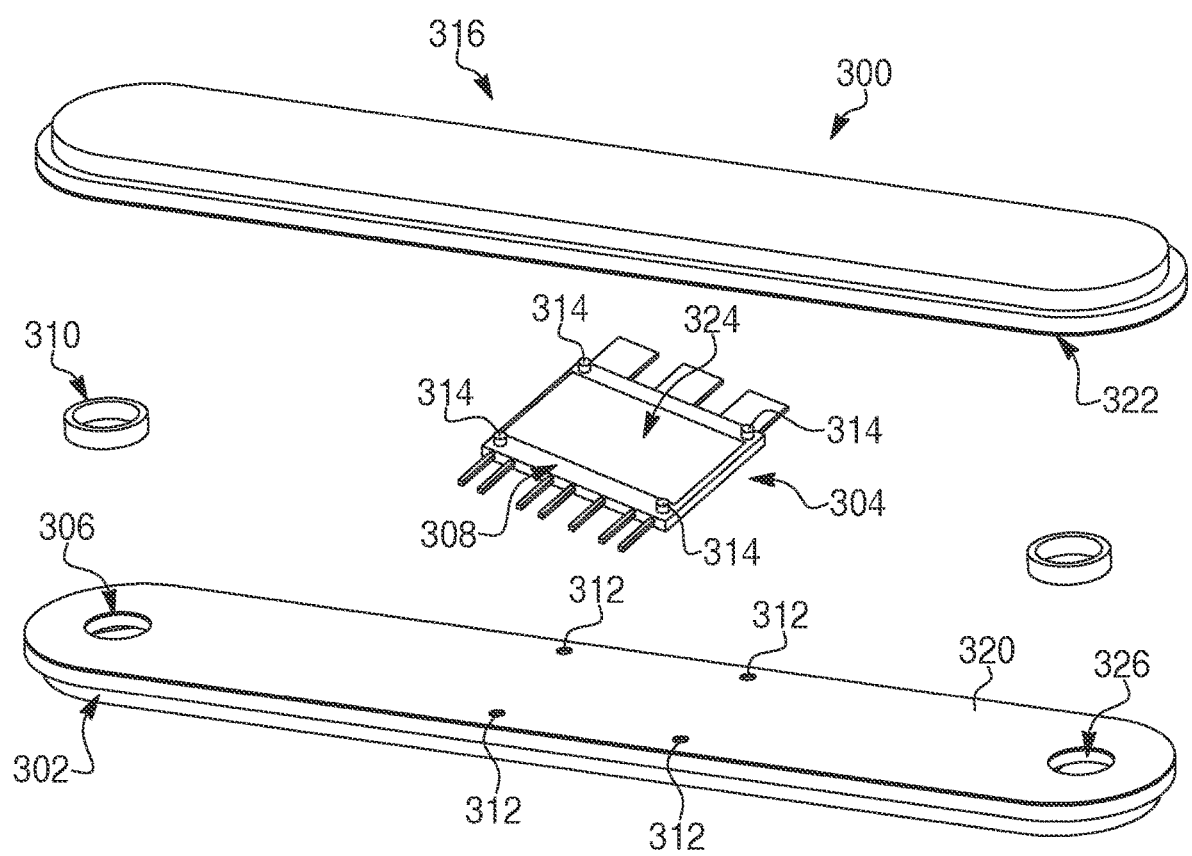
FIG. 3A and FIG. 3B depict another embodiment of the exemplary system of interlocking features on a power module and heat sinks.

The protruding interlocking features 208 may include any suitable size, shape, or configuration. Moreover, though FIG. 2A depicts only two protruding interlocking features 208 on each of top surface 218 and bottom surface 220, those of ordinary skill in the art will understand that any suitable number of protruding interlocking features 208 are within the scope of the embodiments described herein. Indeed, as shown in FIG. 3A, alternative embodiments may include, e.g., four protruding interlocking features, as described in detail below. Still further, the number, size, or configuration of the protruding interlocking features 208 on top surface 218 may be the same as, or differ in one more aspects from, the protruding interlocking features 208 on bottom surface 220. Furthermore, one or more of the protruding interlocking features 208 may include any suitable material known in the art, including, but not limited to, copper, aluminum, or an alloy of copper and aluminum. Each of the protruding interlocking features 208 may be made of the same material composition, or one or more interlocking features 208 may include a material composition that differs from the material composition other protruding interlocking features 208.

In another implementation, only one side of power module 202 may include a plurality of protruding interlocking features 208. For instance, the top surface 218 of the power module may comprise of a plurality of protruding interlocking features 208 but bottom surface 220 of power module 202 may include a flat surface.

The plurality of protruding interlocking features 208 may all be located at an equal distance from the edges of power module 202. For example, one of the plurality of protruding interlocking features 208 may be located, e.g., approximately 2 mm from first edge 226 of power module and one of the other plurality of protruding interlocking features 208 may be located, e.g., approximately 2 mm from a second edge 228 of power module 202. In another implementation, the location of protruding interlocking features 208 from first edge 226 and second edge 228 of the power module 202 may differ in comparison to each other. For instance, one of the plurality of protruding interlocking features 208 may be located, e.g., approximately 3 mm from first edge 226 of power module 202 while one of the other protruding interlocking features 208 may be located, e.g., approximately 5 mm from second edge 228 of power module 202.

Power module 202 may include, e.g., an approximately 800-Volt Silicon Carbide Inverter (e.g., for electrified vehicles), although other suitable structures and uses also are contemplated. Power module 202 may include one or more silicon carbide (SiC)-based power modules that deliver relatively high power densities and efficiencies needed to extend battery range and performance. Power module 202 may contain circuitry and components configured to convert direct current (DC) from the electric vehicle battery to alternating current (AC) current, which can be utilized within the electric motor that drives the propulsion system. Power module 202 may be installed on one or more power board assemblies. Power module 202 may include a combination of transistors, diodes, metal oxide semiconductor field effect transistors (MOSFETs), insulated-gate bipolar transistors (IGBTs), and silicon-controlled rectifiers (SCRs). Power module 202 may include a combination of transistors configured to both a half-bridge and H-bridge configuration, which may allow for the switch ability of the direction of the current through a motor from a single voltage power supply. Additionally, Power module 202 may also include up to six transistors for inverting applications such as switching direct current electricity into alternating current.

First heat sink 204 may include a plurality of recessed interlocking features 210 on surface 216, where the recessed interlocking features 210 include a blind cavity in surface 216. Second heat sink 206 may also include a plurality of recessed interlocking features 212 on surface 214, where the recessed interlocking features include a blind cavity in surface 214.

Recessed interlocking features 210 and 212 may include any suitable size, shape, or configuration. Moreover, though FIG. 2A depicts only two recessed interlocking features 210 and 212 on each of surface 216 of first heat sink 204 and surface 214 of second heat sink 206, those of ordinary skill in the art will understand that any suitable number of recessed interlocking features 210 and 212 are within the scope of the embodiments described herein. Indeed, as shown in FIG. 3A, alternative embodiments may include, e.g., four recessed interlocking features, as described in detail below. Still further, the number, size, or configuration of the recessed interlocking features 210 on surface 216 may be the same as, or differ in one more aspects from, the recessed interlocking features 212 on surface 214.

The plurality of recessed interlocking features 210 and 212 may all be located at an equal distance from the edges of either first heat sink 204 or second heat sink 206. For example, one of the plurality of recessed interlocking features 210 may be located, e.g., approximately 2 mm from a first edge 230 of first heat sink 204 and one of the other plurality of recessed interlocking features 210 may be located, e.g., approximately 2 mm from a second edge 232 of first heat sink 204. In another implementation, the location of recessed interlocking features 210 and 212 from the edges of either first heat sink 204 and second heat sink 206 may differ between each other. For instance, one of the plurality of recessed interlocking features 210 may be, e.g., approximately 3 mm from first edge 230 of first heat sink 204 while one or more of the other plurality of recessed interlocking features 210 may be, e.g., approximately 5 mm from second edge 232 of heat sink 204.

The recessed interlocking features 210 and 212 and protruding interlocking features 208, when engaged, may produce a force that more uniformly spreads the TIM layer (discussed in greater detail below) on first and second heat sinks 204 and 206 which in turn may reduce the bond line thickness. In some examples, the entirety of the applied TIM layer may be within 15%, 10%, 5%, 3%, 2%, 1% or less of a median thickness. Moreover, the entirety of the outer surfaces of all power modules (except for exposed electrical connections) may be covered with TIM. The reduction in bond line thickness may relieve pressure on power module 202, which may reduce the risk of cracks and failure of the power module structure.

Surface 216 of first heat sink 204 and surface 216 of second heat sink 206 may include a layer of thermal interface material (TIM) 222 and 224, respectively, to further aid thermal conduction between first heat sink 204 and power module 202 as well as between second heat sink 206 and power module 202. TIM layers 222 and 224 may include any suitable thermal tapes, gels, thermal epoxies, solders, greases, gap-filled pads, phase change materials, or combinations thereof.

TIM layers 222 and 224 on either surface 214 or 216 may include TIM extending across a substantial entirety, or across only a portion, of either surface 214 and 216. Additionally, TIM layers 222 and 224 may include TIM across a portion of surface 214 and 216 between recessed interlocked features 210 and 212. The amount of TIM extending across surface 214 may be the same as, or differ in one more aspects from, the amount of TIM extending across surface 216. Furthermore, TIM layers 222 and 224 may include any suitable material known in the art, including, but not limited to, silicone elastomer, fiberglass, or combination thereof. Surface 214 may include TIM layer 222 which may be made of the same material composition as TIM layer 224 included on surface 216, or TIM layer 222 may include a material composition that differs from the material composition of TIM layer 224.

TIM layers 222 and 224 may be uniformly composed of the same material. In another implementation, TIM layers 222 and 224 be a composite of different materials. For example, TIM layers 222 and 224 may include a combination of a gel and a grease. In another implementation, for example, TIM layers 222 and 224 disposed in the blind cavity of recessed interlocking features 210 and 212 may be composed of a different material from the TIM layers 222 and 224 included on surfaces 214 and 216.

First heat sink 204 and second heat sink 206 may provide a thermal heat dissipation for power module 202. Heat sinks 204 and 206 may include multiple components. The material of heat sink 204 and 206 may be selected based on the required thermal performance needed to draw heat away from power module 202. For example, heat sinks 204 and 206 may be include an aluminum alloy having a high thermal conductivity while being mechanically soft. In another embodiment, heat sinks 204 and 206 may be include copper. In some embodiments, heat sinks 204 and 206 may be similar to a radiator used in an internal combustion engine and may include a circulating fluid or gas therein. Heat sinks 204 and 206 may be in an extruded, folded fin, bonded fin, active fan, stamping, or cross-cut configuration.

As shown in FIG. 2B, the plurality of protruding interlocking features 208 on top surface 218 of power module 202 may be mated with the plurality of recessed interlocking features 210 of first heat sink 204. Additionally, the plurality of protruding interlocking features 208 on bottom surface 220 of power module 202 may be mated with the plurality of recessed interlocking features 212 of second heat sink 206. The plurality of recessed interlocking features 210 and 212 may be wider than the plurality of protruding interlocking features 208 of power module 202 such that a substantial entirety of protruding interlocking features 208 are received therein. A lubricating material may be included on top of TIM layers 222 and 224 in order to facilitate mating of protruding interlocking features 208 with recessed interlocking features 210 and 212. Top surface 218 and bottom surface 220 of the power module 202 may include an adhesive material (not shown) to keep heat sinks 204 and 206 mated with power module 202 when large amounts of heat is generated by power module 202.

Figure 3B:
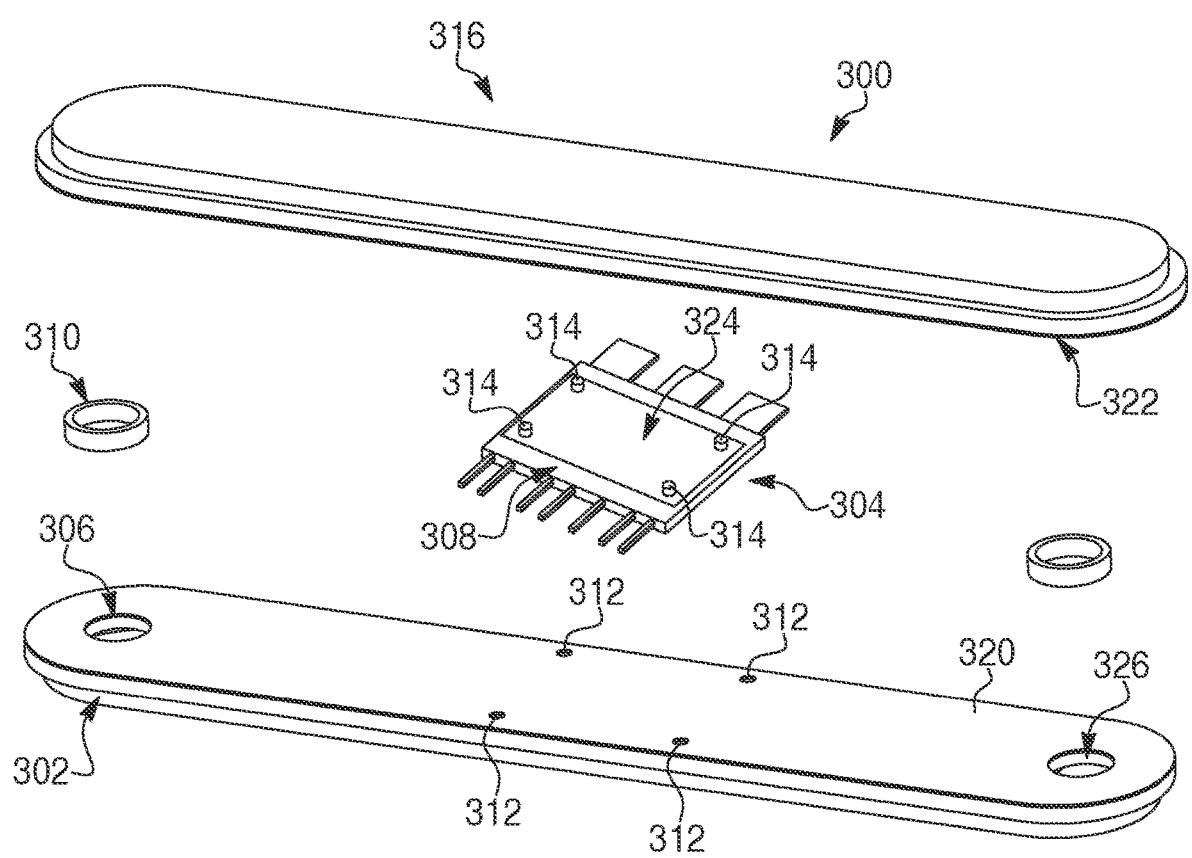

FIG. 3A and FIG. 3B depict another embodiment system 300. In the embodiment of system 300, protruding interlocking features 314 on power module 304 may be located on an epoxy mold compound 308 (as shown in FIG. 3A) or a copper layer 324 (as shown in FIG. 3B). Protruding interlocking features 314 may be located on any area of the epoxy mold compound 308 or copper layer 324 as long as the protruding interlocking features 314 align with corresponding recessed interlocking features 312 located on heat sinks 302 and 316. In both FIGS. 3A and 3B, the TIM layers 322 on both heat sinks 302 and 316 may include TIM extending across a substantial entirety or across only a portion of the surfaces of heat sinks 302 and 316. In another embodiment, TIM may only be included in the area in which the power module 304 will mate with heatsinks 302 and 316.

Heat sinks 302 and 316 may include integral fluid conducting micro-channels used for liquid cooling. In particular, heat sinks 302 and 316 may comprise one or more inlet ports 306 for supplying liquid coolants within the respective heat sink and one or more outlet ports 326 for exhausting coolant that has passed through the fluid conducting micro-channels. Heat sinks 302 and 316 may also include a fluid seal 310 to fluidly seal the inlet port 306 and outlet port 326. The fluid conducting micro-channels coupled with TIM layers may allow for more efficient cooling of the power module.

Figure 4A:
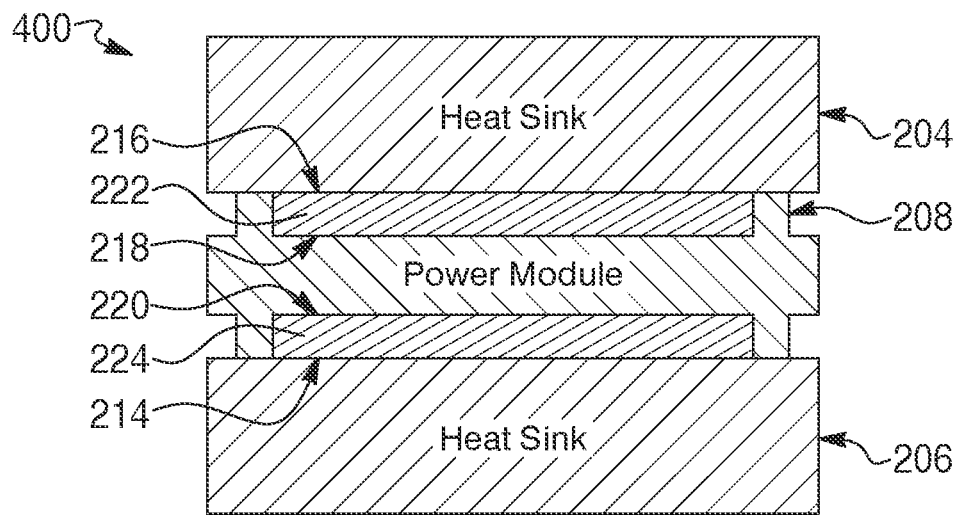
FIG. 4A and FIG. 4B depict another embodiment of the exemplary system of interlocking features on a power module and heat sinks.
Figure 4B:
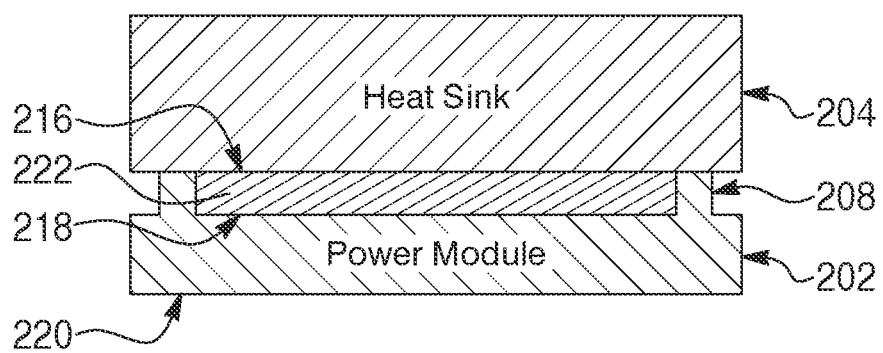

FIG. 4A and FIG. 4B depict another exemplary embodiment system 400 which is similar to the embodiment system 200 (as shown in FIGS. 2A and 2B). However, system 400 differs from system 200 in that surface 216 of first heat sink 204 and surface 214 of second heat sink 206 do not include a plurality of recessed interlocking features (as shown in FIG. 4A). Surface 216 of first heat sink 204 and surface 214 of second heat 206 may be a substantially, flat, or otherwise continuous surface.

The plurality of protruding interlocking features 208 on top surface 218 of power module 202 may be in contact with surface 216 of first heat sink 204 where a gap is formed between surface 216 and top surface 218. Additionally, the plurality of protruding interlocking features 208 on bottom surface 220 of power module 202 may be in contact with surface 214 of second heat sink 206 where a gap is formed between surface 214 and bottom surface 220. The gap formed between the heat sink 204 and 206 and power module 202 may be uniform. In another implementation, the height of the plurality of protruding interlocking features 208 on top surface 218 may differ than the height of the plurality of protruding interlocking on the bottom surface 220. Therefore, the height of the gap formed when the protruding interlocking features 208 on top surface 218 is in contact with surface 216 of first heat sink 204 may differ from the height of the gap formed when the protruding interlocking features 208 on bottom surface 220 is in contact with surface 214 of second heat sink 206.

TIM layers 222 and 224 on either surface 214 or 216 may include TIM extending across a substantial entirety, or across a portion of an area in which the power module does not mate with heat sinks 204 and 206. Moreover, the thickness of TIM layers 222 and 224 may fill the entire gap formed between the surfaces of the heat sink and power module. In another implementation, the amount of TIM filling the gap between top surface 218 and surface 216 of first heat sink 204 may be the same as, or differ in one or more aspects from, the amount of TIM filling the gap between bottom surface 220 and surface 214 of second heat sink 206.

In another embodiment, as shown in FIG. 4B, system 400 may include a power module 202 and a single heat sink 204 (or 206). The plurality of protruding interlocking features 208 may only be included on a single surface (top surface 218 or bottom surface 220) of power module 202 while the other surface (top surface 218 or bottom surface 220) may be a flat or otherwise free surface. The single heat sink 204 (or 206) may not include a plurality of recessed interlocking features 210 (or 212). Surface 218 (or 220) includes the plurality of protruding interlocking features 208 on power module 202 may be brought into proximity of or in contact with surface 216 (or 214) of the single heat sink 204 or 206 such that a gap is formed between surface 216 (or 214) of heat sink 204 or 206 and surface 218 (or 220) of power module 202. TIM layer 222 (or 224) may uniformly fill the gap between surface 216 (or 214) of heat sink 204 (or 206) and surface 218 (or 220) of power module 202. Furthermore, TIM layer 222 (or 224) on surface 216 (or 214) of the single heat sink 204 (or 206) may include TIM extending across an substantial entirety, or across a portion of an area in which the power module may not be in contact with the single heat sink 204 (or 206).

Figure 5A:
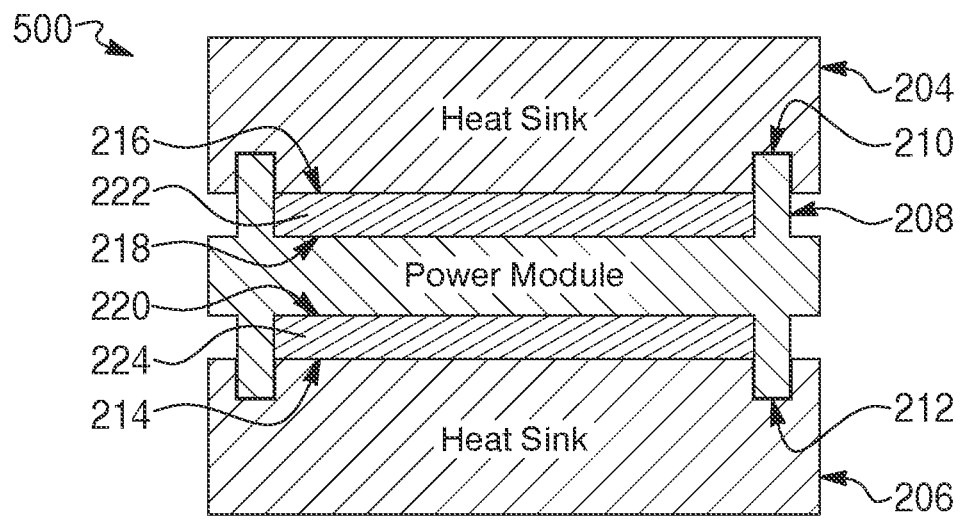
FIG. 5A and FIG. 5B depict another embodiment of the exemplary system of interlocking features on a power module and heat sinks.
Figure 5B:
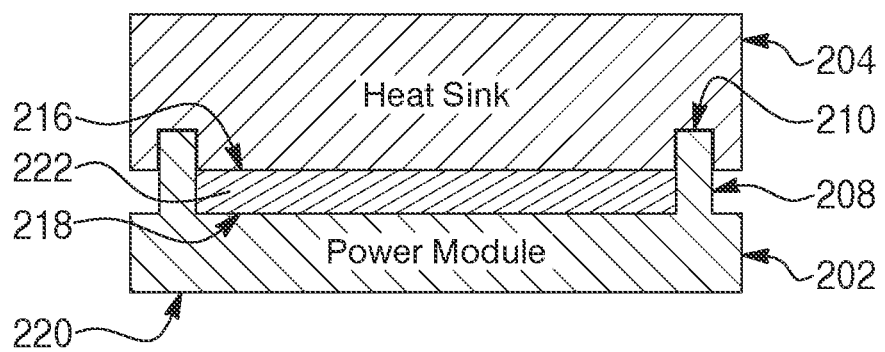

FIG. 5A and FIG. 5B depict another embodiment system 500 which is similar to embodiment system 200 (as shown in FIGS. 2A and 2B). However, system 500 differs from system 200, as shown in FIG. 5A, in that the height of the plurality of protruding interlocking features 208 on top surface 218 may be greater than the depth of the plurality of recessed interlocking features 210 on surface 216 of first heat sink 204. Additionally, the height of the plurality of protruding interlocking features 208 on bottom surface 220 of power module 202 may be greater than the depth of the plurality of recessed interlocking features 212 on surface 214 of second heat sink 206.

The plurality of protruding interlocking features 208 on top surface 218 of power module 202 may be mated with the plurality of recessed interlocking features 210 of first heat sink 204 such that a gap is formed between surface 216 and top surface 218. Additionally, the plurality of protruding interlocking features 208 on bottom surface 220 of power module 202 may be mated with the plurality of recessed interlocking features 212 of second heat sink 206 such that a gap is formed between surface 214 and bottom surface 220. The gap formed between the heat sink 204 and 206 and power module 202 may be uniform. In another implementation, the height of the plurality of protruding interlocking features 208 on the top surface 218 may differ than the height of the plurality of protruding interlocking on the bottom surface 220. Therefore, the height of the gap formed when the protruding interlocking features 208 on top surface 218 are mated to the plurality of recessed interlocking features 210 of first heat sink 204 may differ from the height of the gap formed when the protruding interlocking features 208 on bottom surface 220 are mated to the plurality of recessed interlocking features 212 of second heat sink 206.

TIM layers 222 and 224 on either surface 214 or 216 may include TIM extending across a substantial entirety, or across a portion of an area in which power module 202 does not make contact with heat sinks 204 and 206. Moreover, the thickness of TIM layers 222 and 224 may fill the entire gap formed between the surface of the heat sink and power module. In another implementation, the amount of TIM filling the gap between top surface 218 and surface 216 of first heat sink 204 may be the same as, or differ in one or more aspects from, the amount of TIM filling the gap between bottom surface 220 and surface 214 of second heat sink 206.

In another embodiment, as shown in FIG. 5B, system 500 may include a power module 202 and a single heat sink 204 (or 206). The plurality of protruding interlocking features 208 may only be included on a single surface (top surface 218 or bottom surface 220) of power module 202 while the other surface (top surface 218 or bottom surface 220) may be a flat, free surface. The single heat sink 204 (or 206) may include a plurality of recessed interlocking features 210 (or 212) which may have a depth that is less than the height of the plurality of protruding interlocking features 208. The plurality of protruding interlocking features 208 on power module 202 may be received within a plurality of recessed interlocking features of heat sink 204 (or 206) such that a gap is formed between surface 216 (or 214) of heat sink 204 (or 206) and surface 218 (or 220) of power module 202. TIM layer 222 (or 224) may uniformly fill the gap between surface 216 (or 214) of heat sink 204 (or 206) and surface 218 (or 220) of power module 202. Furthermore, TIM layer 222 (or 224) on surface 216 (or 214) of heat sink 204 (or 206) may include TIM extending across a substantial entirety, or across a portion of an area in which the power module does not mate with the single heat sink 204 (or 206).

Figure 6:
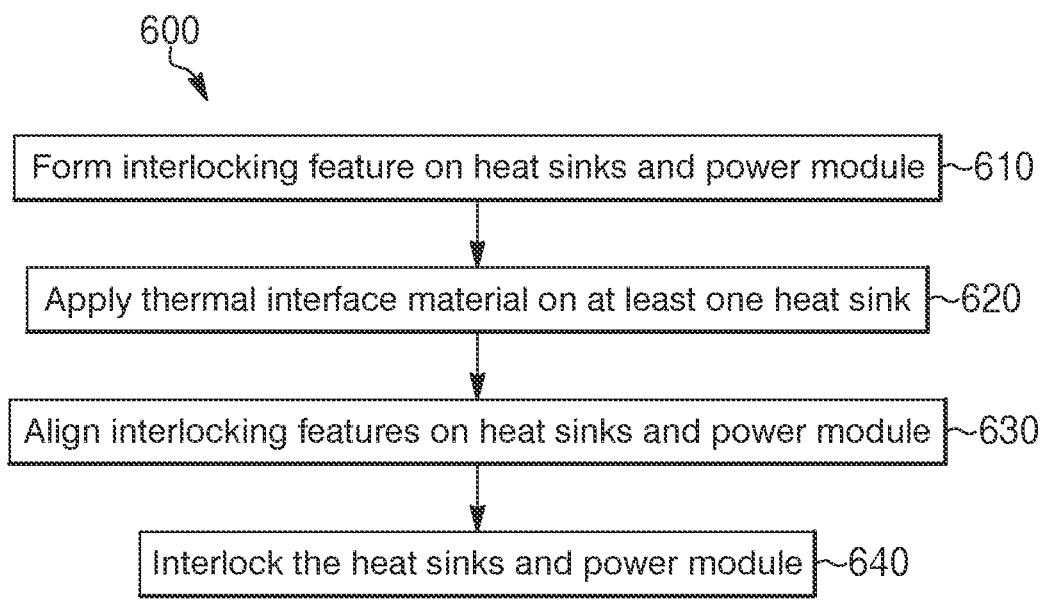
FIG. 6 depicts an exemplary method for aligning interlocking features on a heat sink to interlocking features on a power module.

FIG. 6 depicts an exemplary method 600 for aligning a heat sink to a power module. As shown in FIG. 6, a method 600 may include, at step 610, forming one or more interlocking features on heat sinks 204, 206 and power module 202. For example, slabs of copper may be soldered to external surface of power module 202 to create protruding interlocking features 208. Correspondingly recessed interlocking features 210, 212 may be machined or laser drilled into surfaces 214, 216 of heat sinks 204, 206. Moreover, any suitable analyses, e.g., finite element analysis, may be performed to determine ideal locations for both protruding interlocking features 208 and recessed interlocking features 210, 212.

Once protruding interlocking features 208 and recessed interlocking features 210 and 212 have been formed on power module 202 and heat sinks 204, 206 respectively, thermal interface material 222, 224 may be applied to surfaces of heat sinks 204, 206 or surfaces 218, 220 of power module 202 at step 620. For example, solder paste, silver sinter paste, or a pump may be used to dispense the TIM material on to at least one heat sink 204, 206 or power module 202. In one example, the pump may be a piston pump which may create little to no friction during dispensing of the TIM. In other examples, the pump may be a screw pump for dispensing the TIM. The TIM may be dispensed or otherwise deposited onto heat sinks 204, 206 or power module 202 in any suitable pattern, including, but not limited to, such as a dot, serpentine, or spiral.

Once the TIM has been dispensed on heat sinks 204, 206, protruding interlocking features 208 may be aligned with recessed interlocking features 210 and 212. Subsequently, the protruding interlocking features 208 may be mated (e.g., inserted into) with recessed interlocking features 210, and 212, thereby aligning the one more heat sinks 204, 206 with power module 202 at step 630. Heat sinks 204, 206 and power module 202 may be aligned with one another with a deformable washer or a spring-action clamp. Heat sinks 204, 206 and power module 202 may be interlocked with one another at step 640.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   a power module, wherein the power module includes a first interlocking feature on a first surface of the power module and a second interlocking feature on a second surface of the power module, wherein the first surface is opposite of the second surface;
   a first heat sink, wherein the first heat sink includes a surface including a first layer of thermal interface material, wherein the first interlocking feature mates with the surface of the first heat sink to form a first gap between the first surface and the surface of the first heat sink; and
   a second heat sink, wherein the second heat sink includes a surface including second layer of thermal interface material, wherein the second interlocking feature of the second surface mates with the surface of the second heat sink to form a second gap between the second surface and the surface of the second heat sink.

2. The system of claim 1, wherein the second surface is separated from the first surface by a width of the power module.

3. The system of claim 1, wherein the first interlocking feature is a protruding interlocking feature.

4. The system of claim 1, wherein the surface of the first heat sink is a flat surface.

5. The system of claim 1, wherein the first layer of thermal interface material includes one or more of thermal tapes, gels, thermal epoxies, solders, greases, gap-filled pads, or phase change materials.

6. The system of claim 1, wherein the first surface and second surface include a copper layer.

7. The system of claim 1, wherein a portion of the surface of the first heat sink located outwardly from where the first interlocking feature mates with the surface of the first heat sink includes the first layer of thermal interface material.

8. The system of claim 1, wherein the first gap between the first surface of the power module and the surface of the first heat sink is filled with the first layer of thermal interface material.

9. The system of claim 1, wherein the first layer of thermal interface material extends across an area of the first heat sink where the first interlocking feature on the power module does not mate with the surface of the first heat sink.

10. The system of claim 1, wherein the first heat sink includes an inlet port or an outlet port.

11. A system comprising:
a power module, wherein the power module includes a first interlocking feature on a first surface of the power module; and
at least one heat sink, wherein the at least one heat sink includes a second interlocking feature on a surface of the at least one heat sink,
wherein the first interlocking feature of the first surface of the power module mates with the second interlocking feature on the surface of the at least one heat sink,
wherein the first interlocking feature includes a height greater than a depth of the second interlocking feature,
wherein the surface of the at least one heat sink includes a first portion located interior to the second interlocking feature and a second portion located exterior to the second interlocking feature, and
wherein the first portion and second portion of the surface of the at least one heat sink includes a layer of thermal interface material.

12. The system of claim 11, wherein the power module includes a third interlocking feature on a second surface of the power module, wherein the second surface is separated from the first surface by a width of the power module.

13. The system of claim 12, wherein the first interlocking feature on the first surface mates with the second interlocking feature on the surface of the at least one heat sink to form a gap between the first surface of the power module and the surface of the at least one heat sink.

14. The system of claim 13, wherein the gap between the first surface of the power module and the surface of the at least one heat sink is filled with thermal interface material.

15. The system of claim 12, wherein the first surface and second surface include a copper layer.

16. The system of claim 11, wherein the first interlocking feature is a protruding interlocking feature.

17. The system of claim 11, wherein the second interlocking feature is a recessed interlocking feature.

18. The system of claim 17, wherein the recessed interlocking feature is a blind cavity.

19. The system of claim 11, wherein the thermal interface material extends across an area of the surface of the at least one heat sink where the first interlocking feature on the power module does not mate with the second interlocking feature on the at least one heat sink.

20. The system of claim 11, wherein the at least one heat sink includes an inlet port or an outlet port.

* * * * *